United States Patent
Cho et al.

(10) Patent No.: US 12,371,786 B2
(45) Date of Patent: Jul. 29, 2025

(54) SUBSTRATE PROCESSING METHOD

(71) Applicant: JUSUNG ENGINEERING CO., LTD., Gwangju-si (KR)

(72) Inventors: Il Hyong Cho, Gwangju-si (KR); Duck Ho Kim, Gwangju-si (KR); Chul-Joo Hwang, Gwangju-si (KR)

(73) Assignee: JUSUNG ENGINEERING CO., LTD. (KR)

( * ) Notice: Subject to any disclaimer, the term of this patent is extended or adjusted under 35 U.S.C. 154(b) by 559 days.

(21) Appl. No.: 17/790,501

(22) PCT Filed: Dec. 29, 2020

(86) PCT No.: PCT/KR2020/019299
§ 371 (c)(1),
(2) Date: Jun. 30, 2022

(87) PCT Pub. No.: WO2021/137581
PCT Pub. Date: Jul. 8, 2021

(65) Prior Publication Data
US 2023/0057538 A1 Feb. 23, 2023

(30) Foreign Application Priority Data
Dec. 30, 2019 (KR) .................. 10-2019-0178242

(51) Int. Cl.
*C23C 16/455* (2006.01)
*C23C 16/52* (2006.01)
(Continued)

(52) U.S. Cl.
CPC .. *C23C 16/45544* (2013.01); *C23C 16/45523* (2013.01); *C23C 16/45561* (2013.01);
(Continued)

(58) Field of Classification Search
CPC ........ C23C 16/45544; C23C 16/45523; C23C 16/45561; C23C 16/52
See application file for complete search history.

(56) References Cited

U.S. PATENT DOCUMENTS 6,286,230 B1 * 9/2001 White ............... H01L 21/67173
414/217
6,333,272 B1 * 12/2001 McMillin .......... H01L 21/67069
438/935

(Continued)

FOREIGN PATENT DOCUMENTS

EP 0637058 B1 * 3/2004 ............. H01L 21/00
JP 2012164736 A 8/2012
(Continued)

OTHER PUBLICATIONS

Fitzpatrick, P. Ryan, et al., "Evaluating operating conditions for continuous atmospheric atomic layer deposition using a multiple slit gas source head". J.Vac. Sci. Technol. A 30(1), Jan./Feb. 2012, 01A136-1 to 01A136-10.*

(Continued)

*Primary Examiner* — Bret P Chen
(74) *Attorney, Agent, or Firm* — Renaissance IP Law Group LLP

(57) ABSTRACT

A substrate processing method which can supply gas to a plurality of process chamber through one gas supply unit, and supply different gases at the same time, thereby improving the uniformity of the thicknesses of thin films deposited in the respective chambers. The substrate processing method can perform a process in only one chamber by supplying gas to only the chamber at the same time or perform different processes in the plurality of chambers by supplying different gases to the respective chambers. Therefore, films having (Continued)

uniform thicknesses can be deposited in the respective chambers, and the gas supply efficiency can be improved.

4 Claims, 8 Drawing Sheets

(51) Int. Cl.
    *H01L 21/67*     (2006.01)
    *H01L 21/02*     (2006.01)
    *H01L 21/285*     (2006.01)

(52) U.S. Cl.
    CPC ........ C23C 16/52 (2013.01); *H01L 21/67017*
    (2013.01); *H01L 21/0228* (2013.01); *H01L 21/0262* (2013.01); *H01L 21/28556* (2013.01)

(56) References Cited

U.S. PATENT DOCUMENTS

| | | | | |
|---|---|---|---|---|
| 8,398,771 | B2* | 3/2013 | Nakada | C23C 16/452 118/724 |
| 8,701,593 | B2* | 4/2014 | Mizusawa | C23C 16/45561 118/692 |
| 10,934,619 | B2* | 3/2021 | Kim | H01L 21/68764 |
| 11,227,789 | B2* | 1/2022 | Pore | H01L 21/02219 |
| 2003/0170949 | A1* | 9/2003 | Chouno | H01L 21/67017 438/200 |
| 2006/0110533 | A1* | 5/2006 | Hwang | H01L 21/28556 118/702 |
| 2010/0162955 | A1* | 7/2010 | Lei | H01L 21/67754 118/724 |
| 2011/0117702 | A1* | 5/2011 | Rietzler | H01L 23/5389 118/712 |
| 2011/0226419 | A1* | 9/2011 | Lee | H01J 37/32899 156/345.31 |
| 2013/0045548 | A1 | 2/2013 | Käppeler et al. | |
| 2015/0132970 | A1* | 5/2015 | Nishimura | H10N 50/01 156/345.35 |
| 2016/0312360 | A1* | 10/2016 | Rasheed | H01J 37/32449 |
| 2018/0037990 | A1* | 2/2018 | Kato | C23C 16/345 |
| 2019/0304821 | A1* | 10/2019 | Pierreux | H01L 21/67063 |
| 2023/0203656 | A1* | 6/2023 | Yoshikawa | C23C 16/45561 118/719 |
| 2023/0297837 | A1* | 9/2023 | Paulitsch | G06N 3/084 706/25 |

FOREIGN PATENT DOCUMENTS

| | | |
|---|---|---|
| KR | 20100010868 A | 2/2010 |
| KR | 101013492 B1 | 2/2011 |
| KR | 20110032682 A | 3/2011 |
| KR | 20160046302 A | 4/2016 |
| KR | 20190100045 A | 8/2019 |
| TW | 201303071 A | 1/2013 |
| WO | 2007114156 A1 | 10/2007 |
| WO | WO 2017/131404 A1 * | 1/2017 ............ H01L 21/02 |

OTHER PUBLICATIONS

International Search Report for PCT/KR2020/019299 mailed Mar. 30, 2021.

* cited by examiner

SUBSTRATE PROCESSING METHOD

BACKGROUND

1. Technical Field

The present disclosure relates to a substrate processing method and apparatus, and particularly, to a substrate processing method and apparatus which can supply gas to a plurality of process chamber through one gas supply system, and supply different gases at the same time, thereby improving the uniformity of the thicknesses of thin films deposited in the respective chambers.

2. Related Art

In general, a thin film deposition process, a photolithography process, an etching process and the like are performed in order to fabricate a semiconductor device, and each of the processes is performed in a chamber designed as the optimal environment for the corresponding process. The thin film deposition process refers to a process of forming thin films by depositing a raw material on a silicon wafer, the photolithography process refers to a process of exposing or conceal a region, selected among the thin films, using a photoresist material, and the etching process refers to a process of patterning the selected region in a desired manner by removing the thin film of the selected region.

As a thin film deposition device for forming a predetermined thin film on a silicon wafer, various devices such as a CVD (Chemical Vapor Deposition) device and ALD (Atomic Layer Deposition) device are used. The thin film deposition device is applied to various fields for fabricating semiconductors.

Among the devices, the ALD device can deposit a nano thin film having excellent uniformity. Thus, much attention is being paid to the ALD device as a deposition technology required for fabricating a nano-scale semiconductor device. In particular, the ALD device may precisely control the thickness of a thin film in Angstrom units. Therefore, the ALD device has excellent step coverage, and can uniformly deposit even a complex 3D structure, and precisely control the thickness and composition of the thin film. Thus, the ALD device can deposit a thin film across a large area at uniform speed.

Recently, a cluster-type substrate processing apparatus is used in order to increase productivity. The cluster-type substrate processing apparatus includes a plurality of process modules, a transfer module and a load lock module, which are closely coupled to one another, the transfer module serving to transfer a substrate.

Furthermore, a multi-chamber-type substrate processing apparatus is used, which processes a plurality of substrates at the same time in order to improve productivity of the existing ALD device.

FIG. 1 is a plan view schematically illustrating a configuration of a conventional multi-chamber substrate processing apparatus 100. The conventional multi-chamber substrate processing apparatus includes a plurality of process modules 121 to 123 and a load lock module 130, which are coupled to the around of a transfer module 110.

The transfer module 110 includes a transfer robot 111 installed therein, the transfer robot 111 serving to transfer a substrate S. The substrate S is moved among the plurality of process modules 121 to 123 and the load lock module 130 by the transfer robot 111. The transfer module 110 always maintains a vacuum state except the case in which setting or maintenance is needed.

Each of the process modules 121 to 123 is where an actual process such as thin film deposition or etching is performed on the substrate S within one or more process chambers 121a and 121b, 122a and 122b or 123a and 123b.

The load lock module 130 serves as a buffer space in which the substrate S temporarily stays, when the substrate S is transferred into or out of the plurality of process modules 121 to 123 in a vacuum state. Typically, in consideration of productivity, a structure in which two chambers are vertically stacked is frequently used as the load lock module 130.

Therefore, the load lock module 130 is switched to a vacuum state when the substrate S is transferred into the plurality of process modules 121 to 123 from the outside, and switched to an atmospheric state when the substrate S is transferred to the outside from the plurality of process modules 121 to 123.

FIG. 2 is a side cross-sectional view schematically illustrating a configuration of a conventional multi-chamber substrate processing apparatus.

Referring to FIG. 2, a multi-chamber substrate processing apparatus 200 includes a first process chamber 210 and a second process chamber 220. The first process chamber 210 includes a first substrate seating unit 210a on which a first substrate S1 is seated and a first shower head 210b from which process gas is sprayed, and the second process chamber 220 includes a second substrate seating unit 220a on which a second substrate S2 is seated and a second shower head 220b from which the process gas is sprayed.

A first process gas supply line 211 through which process gas is supplied from a gas supply unit 230 is connected to the first process chamber 210, and opened/closed by a first valve 212. A second process gas supply line 221 through which process gas is supplied from the gas supply unit 230 is connected to the second process chamber 220, and opened/closed by a second valve 222.

For convenience of description, FIG. 2 illustrates each of the first and second process gas supply lines 211 and 221 as one line, and also illustrates each of the first and second valves 212 and 222 as one valve.

However, the first process gas supply line 211 may be constituted by four lines, i.e. a source gas supply line, a source purge gas supply line, a reaction gas supply line and a reaction purge gas supply line, and the second process gas supply line 221 may be constituted by four lines, i.e. a source gas supply line, a source purge gas supply line, a reaction gas supply line and a reaction purge gas supply line.

Furthermore, the first valve 212 may be constituted by four values, i.e. a source gas supply line valve, a source purge gas supply line valve, a reaction gas supply line valve and a reaction purge gas supply line valve, and the second valve 222 may be constituted by four valves, i.e. a source gas supply line valve, a source purge gas supply line valve, a reaction gas supply line valve and a reaction purge gas supply line valve.

Since the first and second valves 212 and 222 are controlled to open/close at the same time, thin films are deposited in the first and second process chambers 210 and 220 under the same processing condition.

FIG. 3 is a timing diagram for describing a flow of the deposition process in the conventional multi-chamber substrate processing apparatus.

As illustrated in FIG. 3, on/off operations of the first and second valves in the conventional multi-chamber substrate processing apparatus are equally controlled to deposit thin films in the first and second process chambers 210 and 220, respectively, under the same processing condition.

That is, process gas is supplied to the first and second process chambers 210 and 220 through the first and second process gas supply lines 211 and 221 diverging from one gas supply unit 230. At this time, the same gas is supplied to the first and second process chambers 210 and 220 at the same time, such that the same kind of thin films are deposited on the first and second substrates S1 and S2.

However, although the on/off operations of the first and second valves are equally controlled, a difference may occur between the times at which the first and second valves are actually opened/closed or between the speeds or flows of the process gases supplied from the first and second process gas supply lines 211 and 221, due to hardware problems.

When such a difference occurs, a deviation may occur between the thickness of a first thin film deposited on the first substrate S1 of the first process chamber 210 and the thickness of a second thin film deposited on the second substrate S2 of the second process chamber 220.

SUMMARY

Various embodiments are directed to a substrate processing method and apparatus which can perform different processes in a plurality of process chambers by supplying different gases to the respective process chambers at the same time, while maintaining the configurations of a gas supply unit, process gas supply lines and process gas supply line valves in the same manner as those of the conventional substrate processing apparatus, thereby improving the uniformity of the thicknesses of thin films deposited in the respective chambers.

In an embodiment, there is provided a substrate processing method of a substrate processing apparatus which includes a gas supply unit configured to supply process gas, a first gas line configured to supply the process gas to a first chamber having a first substrate seated therein, a second gas line configured to supply the process gas to a second chamber having a second substrate seated therein, a third gas line configured to supply the process gas, supplied from the gas supply unit, to each of the first and second gas lines, and a control unit configured to control the gas lines. The substrate processing method may include controlling the process gas, supplied from the gas supply unit, to be supplied to only any one of the first and second gas lines through the third gas line, and processing the first and second substrates with the process gas.

In an embodiment, there is provided a substrate processing method of a substrate processing apparatus which includes a gas supply unit configured to supply process gas, a first gas line configured to supply the process gas to a first chamber, a first valve configured to open/close the first gas line, a second gas line configured to supply the process gas to a second chamber, a second valve configured to open/close the second gas line, and a third gas line configured to supply the process gas, supplied from the gas supply unit, to each of the first and second gas lines. The process gas supplied from the gas supply unit may be supplied to the first and second gas lines through the third gas line, and the supply of the process gas may be controlled through operations of the first and second valves.

In an embodiment, a substrate processing apparatus may include: a gas supply unit configured to supply process gas; a first gas line configured to supply the process gas to a first chamber having a first substrate seated therein; a second gas line configured to supply the process gas to a second chamber having a second substrate seated therein; a third gas line configured to supply the process gas, supplied from the gas supply unit, to each of the first and second gas lines; and a control unit configured to control the first gas line, the second gas line and the third gas line, wherein the process gas supplied from the gas supply unit is supplied to only any one of the first and second gas lines through the third gas line.

In accordance with the embodiments of the present disclosure, the substrate processing method and apparatus can perform different processes in the plurality of chambers by supplying gases to the gas lines for the plurality of chambers through the common gas supply unit and the common flow rate controller, while controlling the gases to be sequentially supplied to the respective chambers. Therefore, films having uniform thicknesses can be deposited in the respective chambers, and the gas supply efficiency can be improved.

DETAILED DESCRIPTION

Hereafter, exemplary embodiments of the present disclosure will be described in detail with reference to the accompanying drawings. The terms used in this specification and claims should not be construed as being limited as typical and dictionary meanings, but be construed as meanings and concepts which coincide with the technical matters of the present disclosure.

The components illustrated in the embodiments and drawings described in this specification are preferred embodiments of the present disclosure and do not represent all the technical ideas of the present disclosure. Thus, various equivalents and modifications, which can substitute the embodiments, may be present at the time of filing the present application.

Figure 1:
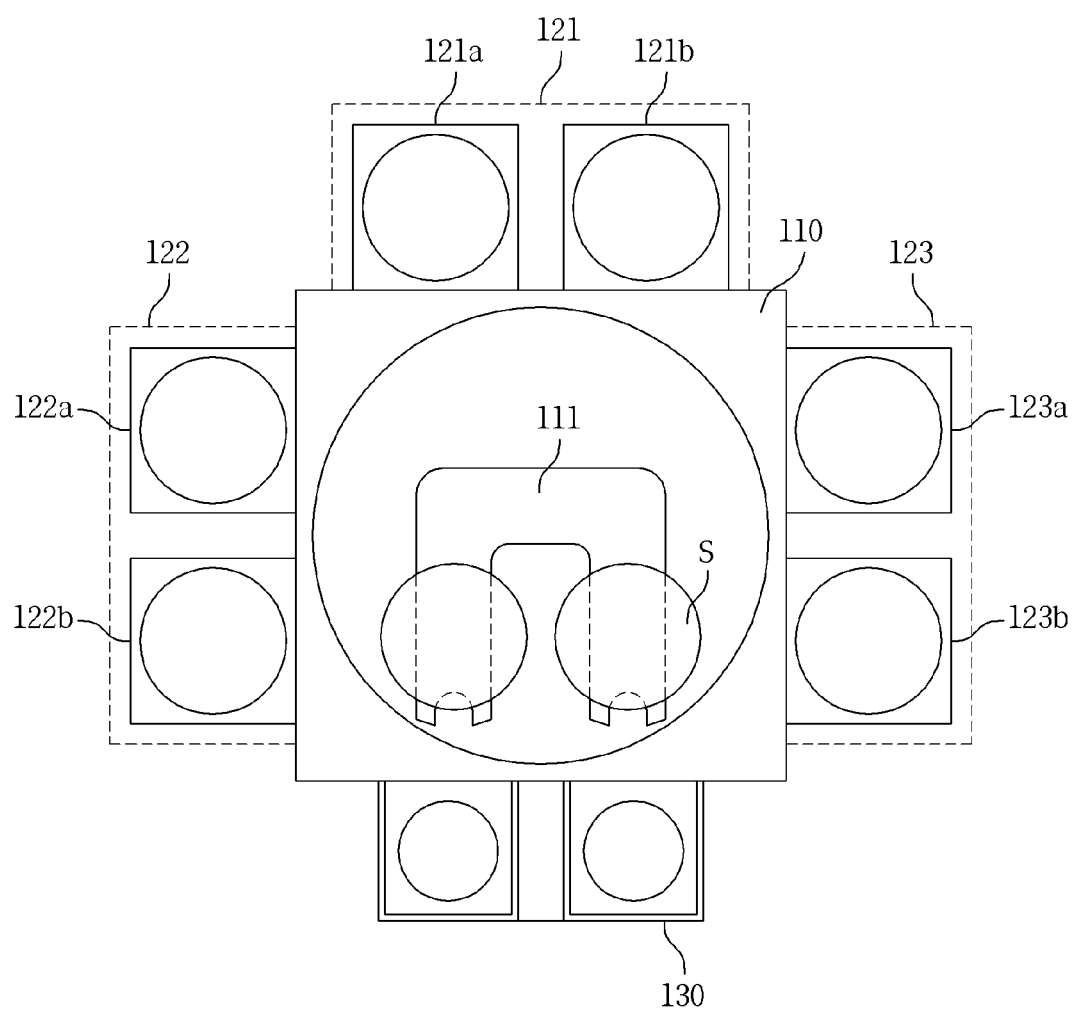
FIG. 1 is a plan view schematically illustrating a configuration of a conventional multi-chamber substrate processing apparatus.
Figure 2:
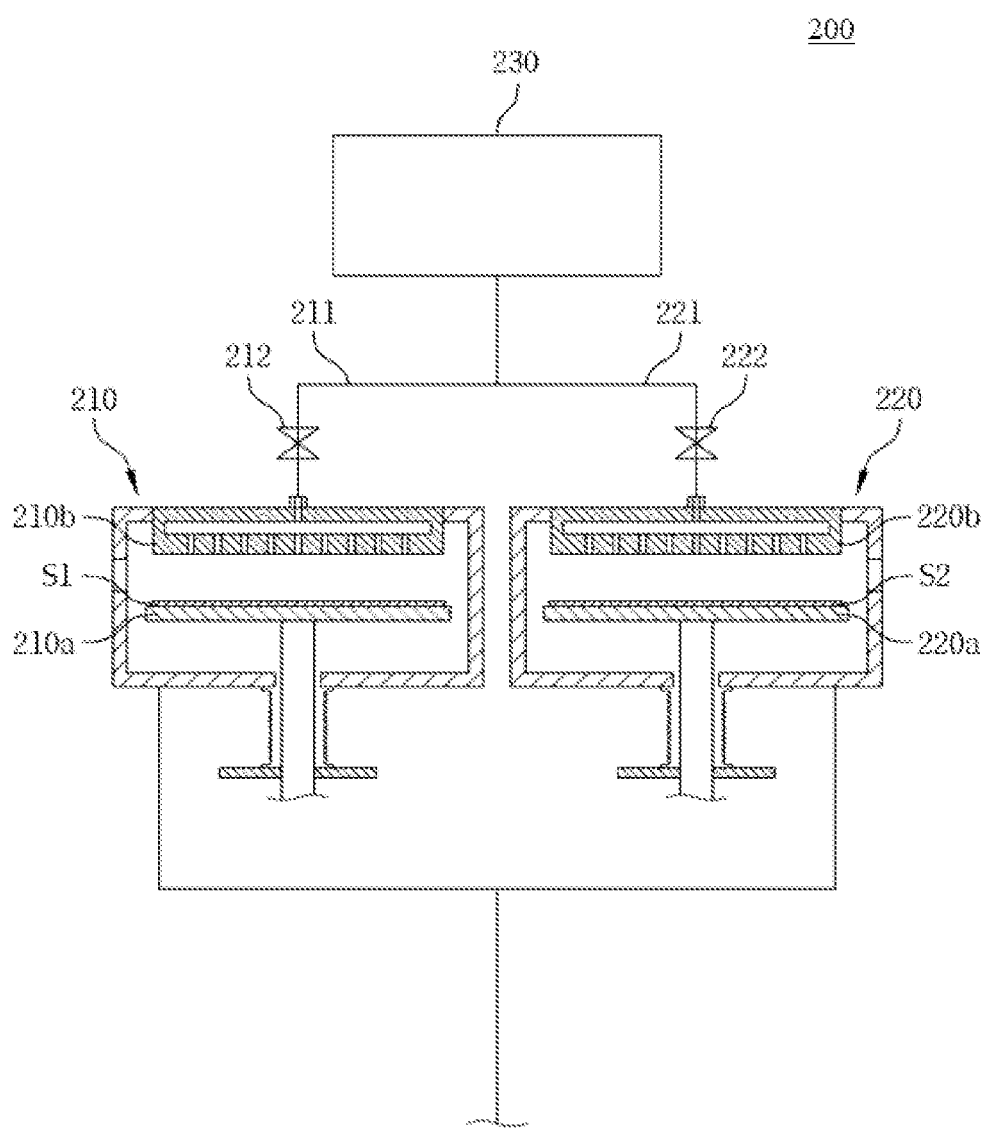
FIG. 2 is a side cross-sectional view schematically illustrating a configuration of a conventional multi-chamber substrate processing apparatus.
Figure 3:
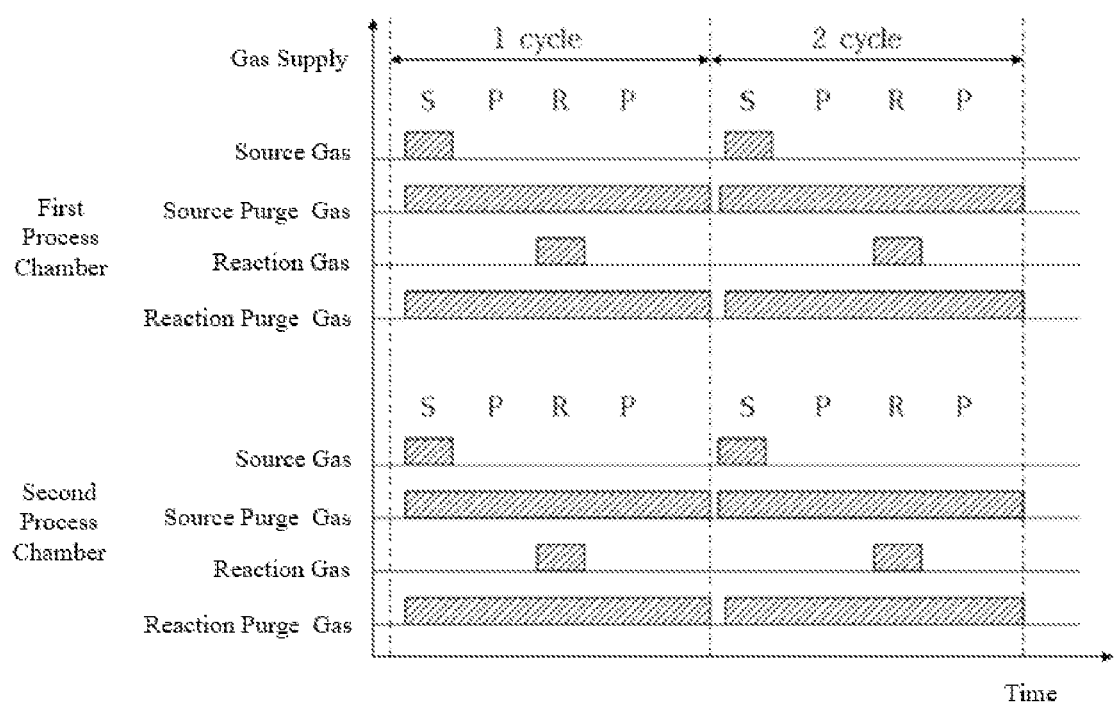
FIG. 3 is a timing diagram for describing a flow of a deposition process in the conventional multi-chamber substrate processing apparatus.
Figure 4:
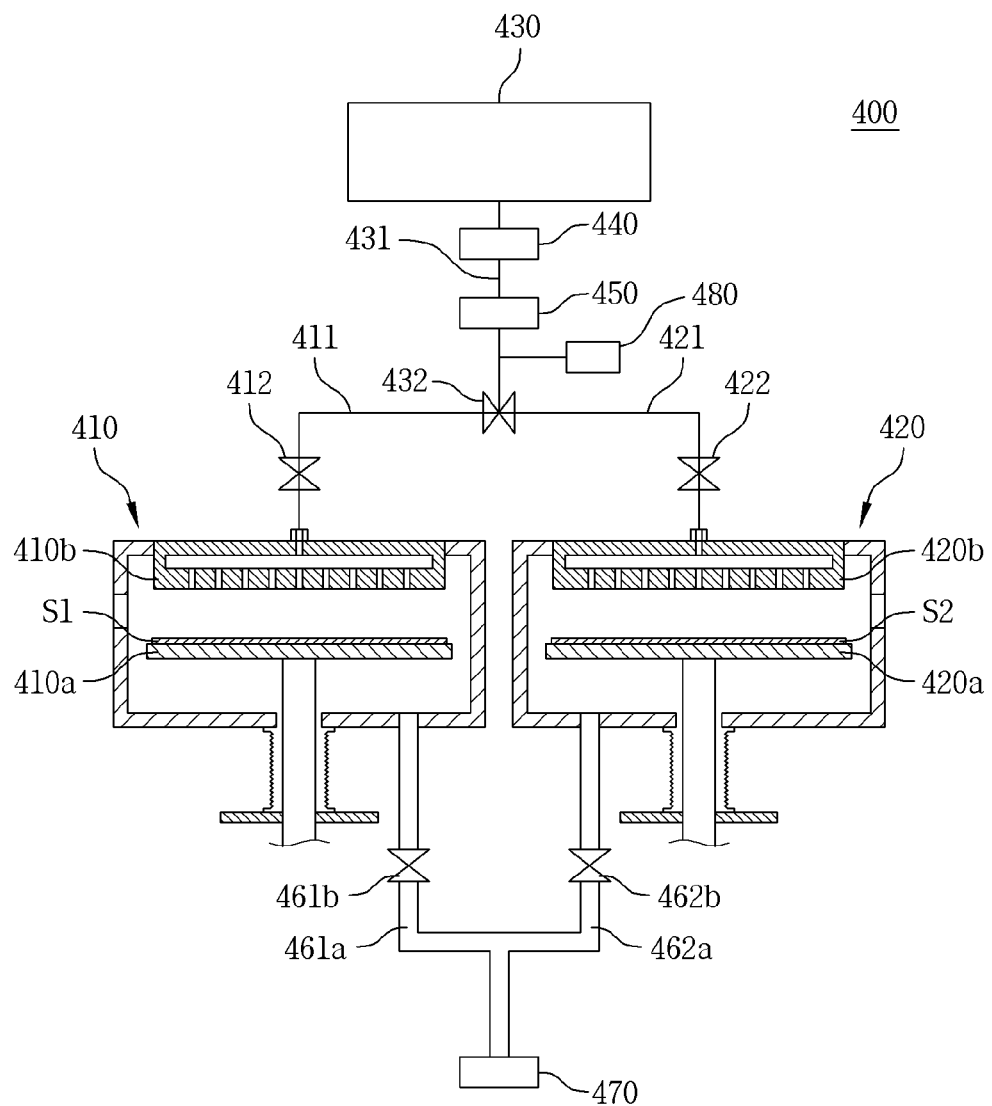
FIG. 4 is a side cross-sectional view schematically illustrating a configuration of a substrate processing apparatus in accordance with an embodiment of the present disclosure.
Figure 5:
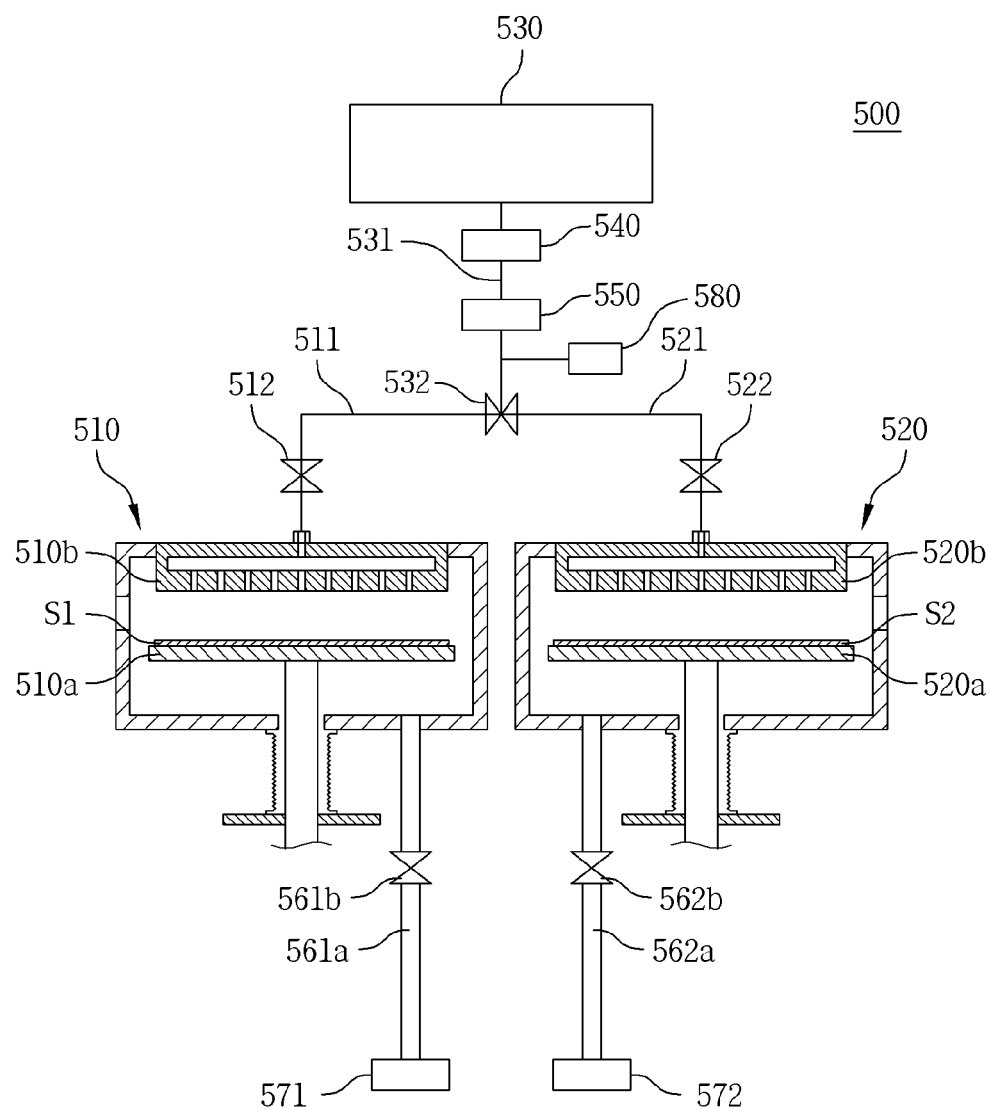
FIG. 5 is a side cross-sectional view schematically illustrating a configuration of a substrate processing apparatus in accordance with another embodiment of the present disclosure.

FIG. 4 is a side cross-sectional view schematically illustrating a configuration of a substrate processing apparatus in accordance with an embodiment of the present disclosure, and FIG. 5 is a side cross-sectional view schematically illustrating a configuration of a substrate processing apparatus in accordance with another embodiment of the present disclosure.

Referring to FIG. 4, a substrate processing apparatus 400 in accordance with the embodiment of the present disclosure includes a gas supply unit 430, a first gas line 411, a first valve 412, a second gas line 421, a second valve 422, a third gas line 431 and a control unit 480. The gas supply unit 430 serves to supply process gas, the first gas line 411 serves to supply the process gas to a first chamber 410, the first valve 412 serves to open/close the first gas line 411, the second gas line 421 serves to supply the process gas to a second chamber 420, the second valve 422 serves to open/close the second gas line 421, the third gas line 431 serves to supply the process gas, supplied from the gas supply unit 430, to only any one of the first and second gas lines 411 and 421, and the control unit 480 serves to control the first gas line 411, the second gas line 421 and the third gas line 431.

The process gas supplied from the gas supply unit 430 is supplied to only any one of the first and second gas lines 411 and 421 through the third gas line 431, and the control unit 480 controls the operations of the first and second valves 412 and 422 to supply the process gas to any one gas line.

The substrate processing apparatus 400 in accordance with the embodiment of the present disclosure includes the first chamber 410 and the second chamber 420. The first chamber 410 includes a first substrate seating unit 410a on which a first substrate S1 is seated and a first shower head 410b from which the process gas is sprayed, and the second chamber 420 includes a second substrate seating unit 420a on which a second substrate S2 is seated and a second shower head 420b from which the process gas is sprayed.

The first gas line 411 through which the process gas is supplied from the gas supply unit 430 is connected to the first chamber 410, and opened/closed by the first valve 412. The second gas line 421 through which the process gas is supplied from the gas supply unit 430 is connected to the second chamber 420, and opened/closed by the second valve 422.

The substrate processing apparatus 400 in accordance with the embodiment of the present disclosure includes a common flow rate controller 440 configured to control the flow rate of gas supplied to any one gas line of the first and second gas lines 411 and 421 through the third gas line 431 from the gas supply unit 430. The gas supplied from the gas supply unit 430 is transferred to the first and second chambers 410 and 420 through the first and second gas lines 411 and 421, respectively, such that a first thin film is formed on the first substrate S1 and a second thin film is formed on the second substrate S2.

The substrate processing apparatus 400 in accordance with the embodiment of the present disclosure may further include a gas storage space 450 which is installed on the third gas line 431 and configured to store the process gas supplied from the gas supply unit 430 and supply the process gas to the first or second gas line 411 or 421.

The substrate processing apparatus 400 in accordance with the embodiment of the present disclosure may further include a third valve 432 which is installed on the third gas line 431 and configured to supply the process gas from the gas supply unit 430 to the first or second gas line 411 or 421 or block the supply of the process gas.

For convenience of description, FIG. 4 illustrates each of the first and second gas lines 411 and 421 as one line, and also illustrates each of the first and second valves 412 and 422 as one valve.

However, the first gas line 411 may be constituted by four lines, i.e. a source gas supply line, a source purge gas supply line, a reaction gas supply line and a reaction purge gas supply line, and the second gas line 421 may be constituted by four lines, i.e. a source gas supply line, a source purge gas supply line, a reaction gas supply line and a reaction purge gas supply line.

The first valve 412 may be constituted by four valves, i.e. a source gas supply line valve, a source purge gas supply line valve, a reaction gas supply line valve and a reaction purge gas supply line valve, and the second valve 422 may be constituted by four valves, i.e. a source gas supply line valve, a source purge gas supply line valve, a reaction gas supply line valve and a reaction purge gas supply line valve.

Under the first chamber 410, a first exhaust line 461a and a first exhaust valve 461b are formed, and under the second chamber 420, a second exhaust line 462a and a second exhaust valve 462b are formed. The first and second exhaust lines 461a and 462a are connected to a common exhaust pump 470.

In the substrate processing apparatus 400 in accordance with the embodiment of the present disclosure, the process gas is not supplied to the second chamber 420 during a first step in which source gas, source purge gas, reaction gas and reaction purge gas are sequentially supplied to the first chamber 410 such that the first thin film is deposited on the first substrate S1.

Furthermore, the process gas is not supplied to the first chamber 410 during a second step in which the source gas, the source purge gas, the reaction gas and the reaction purge gas are sequentially supplied to the second chamber 420 such that the second thin film is deposited on the second substrate S2.

A substrate processing apparatus 500 of FIG. 5 in accordance with another embodiment of the present disclosure has the same configuration as that of FIG. 4, except that a first exhaust line 561a and a first exhaust valve 561b, which are formed under a first chamber 510, are connected to a first exhaust pump 571, and a second exhaust line 562a and a second exhaust valve 562b, which are formed under a second chamber 520, are connected to a separate second exhaust pump 572.

Referring to FIG. 5, the substrate processing apparatus 500 in accordance with the another embodiment of the present disclosure includes a gas supply unit 530, a first gas line 511, a first valve 512, a second gas line 521, a second valve 522, a third gas line 531, a third valve 532 and a control unit 580. The gas supply unit 530 serves to supply process gas, the first gas line 511 serves to supply the process gas to the first chamber 510, the first valve 512 serves to open/close the first gas line 511, the second gas line 521 serves to supply the process gas to the second chamber 520, the second valve 522 serves to open/close the second gas line 521, the third gas line 531 serves to supply the process gas, supplied from the gas supply unit 530, to the first and second gas lines 511 and 521, the third valve 532 serves to open/close the third gas line 531 and the control unit 580 serves to control the first gas line 511, the second gas line 521 and the third gas line 531.

The substrate processing apparatus 500 in accordance with the another embodiment of the present disclosure includes the first chamber 510 and the second chamber 520. The first chamber 510 includes a first substrate seating unit 510a on which a first substrate S1 is seated and a first shower head 510b from which the process gas is sprayed, and the second chamber 520 includes a second substrate seating unit 520a in which a second substrate S2 is seated and a second shower head 520b from which the process gas is sprayed.

The substrate processing apparatus 500 in accordance with the another embodiment of the present disclosure includes a common flow rate controller 540 configured to control the flow rates of gases supplied from the gas supply unit 530 to the first and second gas lines 511 and 521 through the third gas line 531.

The substrate processing apparatus 500 in accordance with the another embodiment of the present disclosure may further include a gas storage space 550 which is installed on the third gas line 531 and configured to store the process gas supplied from the gas supply unit 530 and supply the process gas to the first or second gas line 511 or 521. In the substrate processing apparatus 500 illustrated in FIG. 5, reaction gas, reaction purge gas, source gas, and source purge gas are sequentially supplied to the second chamber 520 such that a second thin film is deposited on the second substrate S2, during a first step in which the source gas, the source purge gas, the reaction gas and the reaction purge gas are sequentially supplied to the first chamber 510 such that a first thin film is deposited on the first substrate S1.

The substrate processing apparatus 500 illustrated in FIG. 5 can shorten the process time, compared to the substrate processing apparatus 400 illustrated in FIG. 4.

Figure 6:
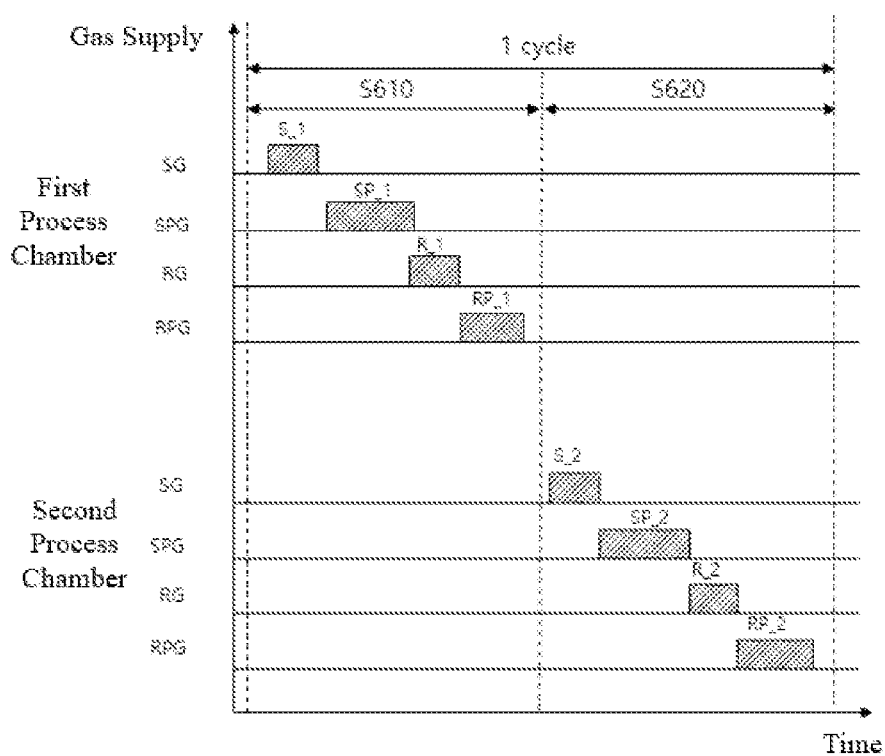
FIG. 6 is a timing diagram for describing a flow of a substrate processing method in accordance with an embodiment of the present disclosure.

FIG. 6 is a timing diagram for describing a flow of a substrate processing method in accordance with an embodiment of the present disclosure.

Referring to FIG. 6, the substrate processing method in accordance with the embodiment of the present disclosure includes a first step S610 and a second step S620.

The substrate processing method in accordance with the embodiment of the present disclosure is a substrate processing method using a substrate processing apparatus which includes a gas supply unit configured to supply process gas, a first gas line configured to supply the process gas to a first chamber having a first substrate seated therein, a second gas line configured to supply the process gas to a second chamber having a second substrate seated therein, a third gas line configured to supply the process gas, supplied from the gas supply unit, to each of the first and second gas lines, and a control unit configured to control the respective gas lines. The substrate processing method includes controlling the process gas, supplied from the gas supply unit, to be supplied to only any one of the first and second gas lines through the third gas line, and processing the first and second substrates with the process gas.

In the first step S610, the process gas is supplied to the first chamber, and not supplied to the second chamber. The first step S610 includes forming a first thin film on a first substrate S1 by sequentially repeating a first source process S_1 of spraying source gas into the first chamber, a first source purge process SP_1 of spraying source purge gas into the first chamber, a first reaction process R_1 of spraying reaction gas into the first chamber, and a first reaction purge process RP_1 of spraying reaction purge gas into the first chamber.

In the second step S620, the process gas is supplied to the second chamber, and not supplied to the first chamber. The second step S620 includes forming a second thin film on a second substrate S2 by sequentially repeating a second source process S_2 of spraying source gas into the second chamber, a second source purge process SP_2 of spraying source purge gas into the second chamber, a second reaction process R_2 of spraying reaction gas into the second chamber, and a second reaction purge process RP_2 of spraying reaction purge gas into the second chamber.

The first step S610 and the second step S620 are sequentially performed. At this time, the first and second steps S610 and S620 are set to one cycle, and the first and second thin films are formed on the first and second substrates S1 and S2, respectively, while the cycle is repeated.

In the first step S610, the process gas is not supplied to the second chamber, and the deposition of a thin film is not performed in the second chamber. In the second step S620, the process gas is not supplied to the first chamber, and the deposition of a thin film is not performed in the first chamber.

Figure 7:
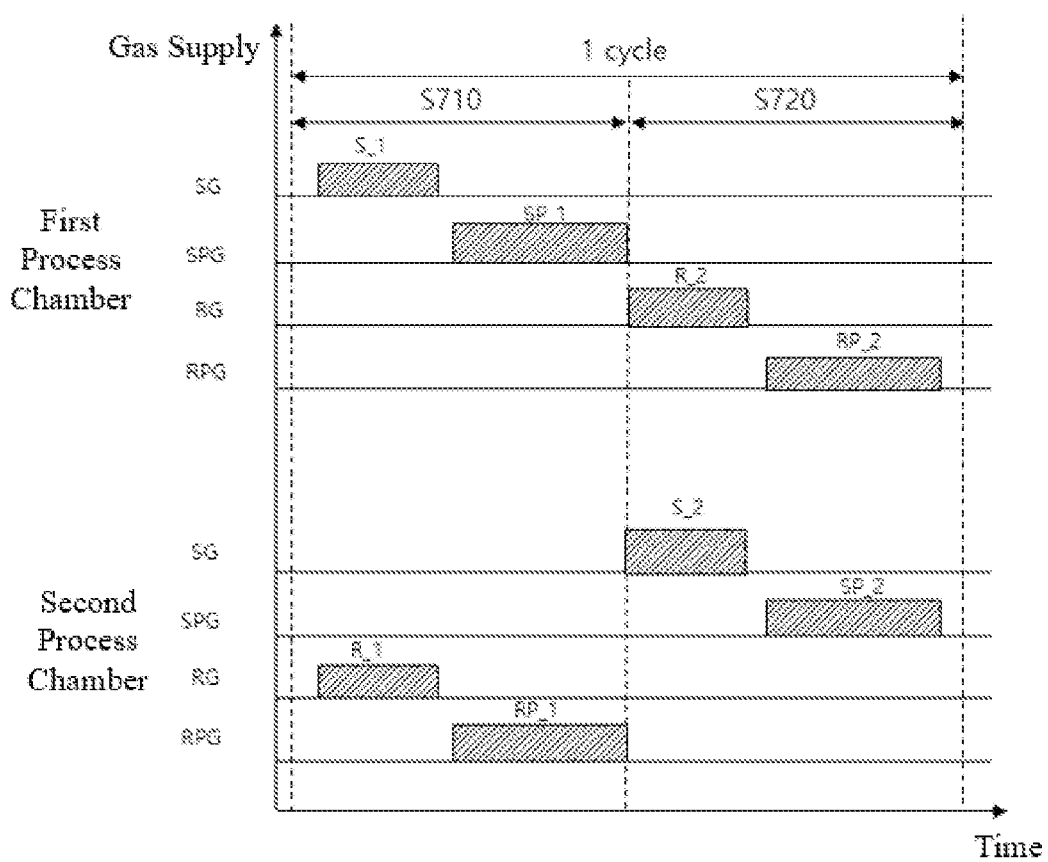
FIG. 7 is a timing diagram for describing a flow of a substrate processing method in accordance with another embodiment of the present disclosure.

FIG. 7 is a timing diagram for describing a flow of a substrate processing method in accordance with another embodiment of the present disclosure.

Referring to FIG. 7, the substrate processing method in accordance with the another embodiment of the present disclosure includes a first step S710 and a second step S720.

The substrate processing method in accordance with the another embodiment of the present disclosure is a substrate processing method using a substrate processing apparatus which includes a gas supply unit configured to supply process gas, a first gas line configured to supply the process gas to a first chamber, a first valve configured to open/close the first gas line, a second gas line configured to supply the process gas to a second chamber, a second valve configured to open/close the second gas line, and a third gas line configured to supply the process gas, supplied from the gas supply unit, to each of the first and second gas lines. The substrate processing method includes supplying the process gas, supplied from the gas supply unit, to the first and second gas lines through the third gas line, and controlling the supply of the process gas through the operations of the first and second valves.

In the first step S710, a first source process S_1 of spraying source gas into the first chamber, a first source purge process SP_1 of spraying source purge gas into the first chamber, a first reaction process R_1 of spraying reaction gas into the second chamber, and a first reaction purge process RP_1 of spraying reaction purge gas into the second chamber are performed.

In the second step S720, a second reaction process R_2 of spraying reaction gas into the first chamber, a second reaction purge process RP_2 of spraying reaction purge gas into the first chamber, a second source process S_2 of spraying source gas into the second chamber, and a second source purge process SP_2 of spraying source purge gas into the second chamber are performed.

The substrate processing method in accordance with the another embodiment of the present disclosure includes depositing thin films on first and second substrates S1 and S2, respectively, while repeating one cycle in which the first step S710 is performed and the second step S720 is then performed.

In the first step S710, the first source process S_1 and the first reaction process R_1 are performed at the same time, and in the second step S720, the second reaction process R_2 and the second source process S_2 are performed at the same time.

That is, while source gas is supplied to the first chamber to perform the first source process S_1, reaction gas is supplied to the second chamber to perform the first reaction process R_1, and while reaction gas is supplied to the first chamber to perform the second reaction process R_2, source gas is supplied to the second chamber to perform the second source process S_2.

As the thin film deposition is performed in each of the first and second chambers within one cycle, the entire time of the thin film deposition process may be reduced.

Figure 8:
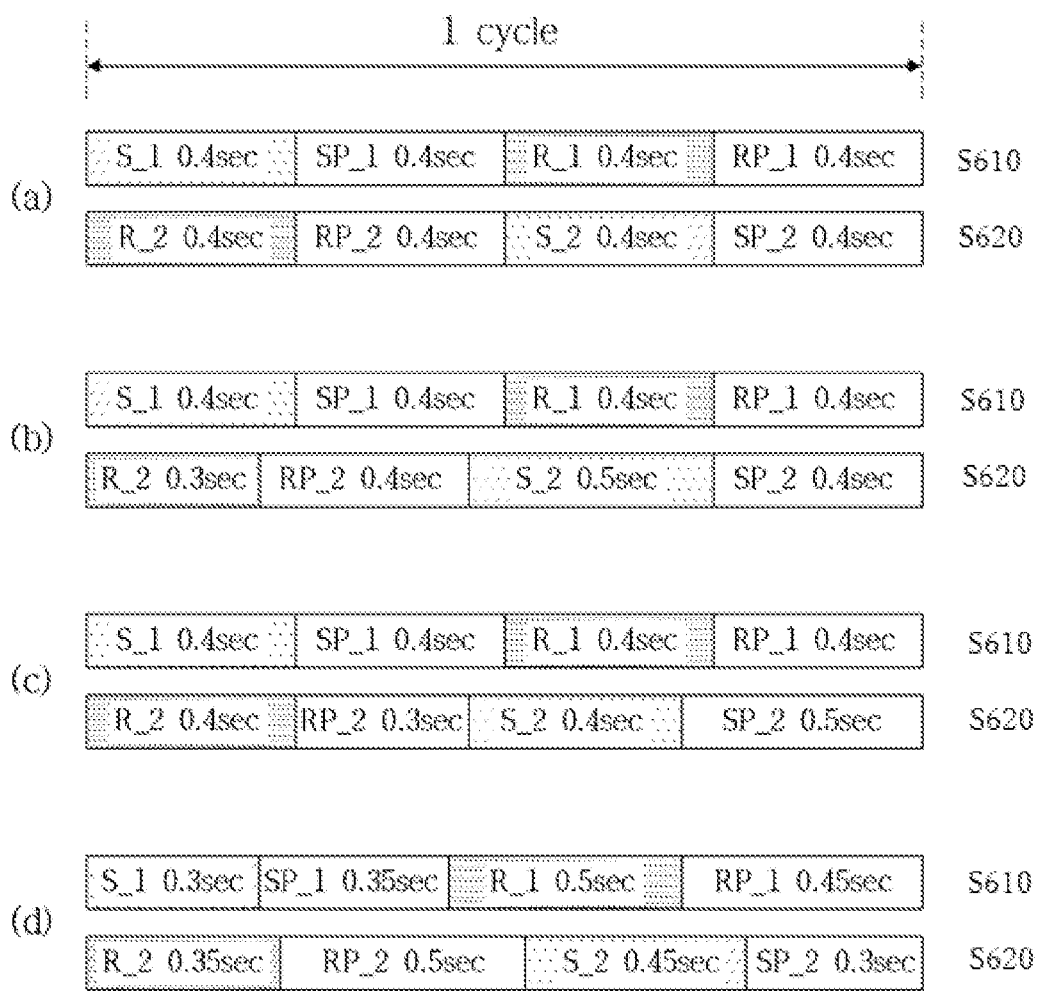
FIG. 8 is a diagram for describing an example of the substrate processing method in accordance with the another embodiment of the present disclosure.

FIG. 8 is a diagram for describing an example of the substrate processing method of FIG. 6 in accordance with the embodiment of the present disclosure.

Referring to FIG. 8, the entire process time of the first step S610 and the entire process time of the second step S620 are equal to each other, but the times of the processes constituting each of the first and second steps S610 and S620 may be varied.

That is, the time during which each of the first source process S_1, the first source purge process SP_1, the first reaction process R_1 and the first reaction purge process RP_1 of the first step S610 is performed and the time during which each of the second reaction process R_2, the second reaction purge process RP_2, the second source process S_2 and the second source purge process SP_2, of the second step S620 is performed may be varied.

This indicates that, when the thickness of the first thin film formed on the first substrate S1 in the first step S610 and the thickness of the second thin film formed on the second substrate S2 in the second step S620 are different from each other, the detailed process times of the first and second steps S610 and S620 may be adjusted to improve the uniformity of the thicknesses of the thin films.

FIG. 8A illustrates a process in which the substrate processing method in accordance with the present disclosure is normally performed.

In the substrate processing method in accordance with the present disclosure as illustrated in FIG. 8A, the time during which each of the first source process S_1, the first source purge process SP_1, the first reaction process R_1 and the first reaction purge process RP_1 of the first step S610 is performed and the time during which each of the second reaction process R_2, the second reaction purge process RP_2, the second source process S_2 and the second source purge process SP_2 of the second step S620 is performed may be set to the same time of 0.4 sec, for example. In this case, thin films having a uniform thickness may be formed on the first and second substrates S1 and S2.

Due to various causes, the thicknesses of the first and second thin films may differ from each other. When the thicknesses of the first and second thin films are different from each other, the detailed process times of the first and second steps S610 and S620 may be adjusted to control the uniformity of the thicknesses of the thin films.

As illustrated in FIG. 8B, the process times of the respective processes in the first step S610 may be maintained as 0.4 sec, and the process time of the second reaction process R_2 in the second step S620 may be reduced to 0.3 sec, and the process time of the second source process S_2 in the second step S620 may be adjusted to 0.5 sec, which makes it possible to adjust the uniformity of the thicknesses of the thin films. At this time, the process times of the second reaction purge process RP_2 and the second source purge process SP_2 are maintained as 0.4 sec which is equal to the process times of the first source purge process SP_1 and the first reaction purge process RP_1. Therefore, a time obtained by adding the process time of the first source process S_1 and the process time of the first reaction process R_1 is equal to a time obtained by adding the process time of the second reaction process R_2 and the process time of the second source process S_2.

As illustrated in FIG. 8C, the process times of the respective processes in the first step S610 may be maintained as 0.4 sec, the process time of the second reaction purge process RR_2 in the second step S620 may be reduced to 0.3 sec, and the process time of the second source purge process SP_2 in the second step S620 may be adjusted to 0.5 sec, which makes it possible to adjust the uniformity of the thicknesses of the thin films. At this time, the process times of the second reaction process R_2 and the second source process S_2 are maintained as 0.4 sec which is equal to the process times of the first source process S_1 and the first reaction process R_1. Therefore, a time obtained by adding the process time of the first source purge process SP_1 and the process time of the first reaction purge process RP_1 is equal to a time obtained by adding the process time of the second reaction purge process RP_2 and the process time of the second source purge process SP_2.

As illustrated in FIG. 8D, the time during which each of the first source process S_1, the first source purge process SP_1, the first reaction process R_1 and the first reaction purge process RP_1 of the first step S610 is performed and the time during which each of the second reaction process R_2, the second reaction purge process RP_2, the second source process S_2 and the second source purge process SP_2 of the second step S620 is performed may be all changed to adjust the uniformity of the thicknesses of the thin films.

At this time, a time obtained by adding the process time of the first source process S_1, the process time of the first source purge process SP_1, the process time of the first reaction process R_1 and the process time of the first reaction purge process RP_1 is equal to a time obtained by adding the process time of the second reaction process R_2, the process time of the second reaction purge process RP_2, the process time of the second source process S_2 and the process time of the second source purge process SP_2.

That is, the substrate processing method in accordance with the embodiment of the present disclosure can adjust the uniformity of the thicknesses of the thin films by changing the times of the source process and the reaction process while equally maintaining the times of the purge processes for the respective chambers, changing the time of the purge process while equally maintaining the times of the source process and the reaction process, or changing all the times of the source process, the reaction process and the purge process.

As described above, the substrate processing method in accordance with the embodiment of the present disclosure may supply gases to the process gas supply lines through the common gas supply unit and the common flow rate controller in the substrate processing apparatus including the plurality of chambers, and supply gas to only any one chamber at the same time, such that a process is performed in only one chamber, or supply different gases to the respective chambers such that different processes are performed in the respective chambers, thereby depositing thin films having uniform thicknesses in the respective process chambers, and improving the efficiency of the gas supply.

While various embodiments have been described above, it will be understood to those skilled in the art that the embodiments described are by way of example only. Accordingly, the disclosure described herein should not be limited based on the described embodiments.

What is claimed is:

1. A substrate processing method of a substrate processing apparatus which includes a gas supply unit configured to supply process gas, a first gas line configured to supply the process gas to a first chamber, a first valve configured to open/close the first gas line, a second gas line configured to supply the process gas to a second chamber, a second valve configured to open/close the second gas line, and a third gas line configured to supply the process gas, supplied from the gas supply unit, to each of the first and second gas lines, wherein the process gas supplied from the gas supply unit is supplied to the first and second gas lines through the third gas line, and the supply of the process gas is controlled through operations of the first and second valves, wherein the process gas comprises any one of source gas and reaction gas, wherein the substrate processing method comprises: a first step of supplying source gas of the process gas to the first chamber, and supplying reaction gas of the process gas to the second chamber; and a second step of supplying the reaction gas of the process gas to the first chamber and supplying the source gas of the process gas to the second chamber.

2. The substrate processing method of claim 1, wherein a process of performing the first step and then performing the second step is set to one cycle, and the one cycle is repeatedly performed.

3. The substrate processing method of claim 1, further comprising supplying purge gas after the first and second steps.

4. The substrate processing method of claim 1, wherein the supply times of the source gas and the reaction gas are different from each other.

* * * * *